(12) United States Patent
Xing et al.

(10) Patent No.: US 10,500,816 B2
(45) Date of Patent: Dec. 10, 2019

(54) SUBSTRATE STRUCTURE, METHOD FOR ATTACHING FLEXIBLE SUBSTRATE AND METHOD FOR PEELING OFF FLEXIBLE SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jianguo Xing, Beijing (CN); Hetao Wang, Beijing (CN); Bin Yan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 206 days.

(21) Appl. No.: 15/539,854

(22) PCT Filed: Nov. 11, 2016

(86) PCT No.: PCT/CN2016/105511
§ 371 (c)(1),
(2) Date: Jun. 26, 2017

(87) PCT Pub. No.: WO2017/118217
PCT Pub. Date: Jul. 13, 2017

(65) Prior Publication Data
US 2018/0015693 A1   Jan. 18, 2018

(30) Foreign Application Priority Data
Jan. 4, 2016   (CN) .......................... 2016 1 0005547

(51) Int. Cl.
*B32B 7/12* (2006.01)
*H01L 21/78* (2006.01)
*H01L 21/762* (2006.01)
*B32B 37/12* (2006.01)
*B32B 38/10* (2006.01)
*H01L 51/00* (2006.01)
*B32B 37/14* (2006.01)

(52) U.S. Cl.
CPC ................ *B32B 7/12* (2013.01); *B32B 37/12* (2013.01); *B32B 38/10* (2013.01); *H01L 21/762* (2013.01); *H01L 21/78* (2013.01); *B32B 2037/148* (2013.01); *B32B 2307/204* (2013.01); *B32B 2457/20* (2013.01); *H01L 51/003* (2013.01); *H01L 51/0097* (2013.01)

(58) Field of Classification Search
CPC ............ B32B 7/12; B32B 37/12; B32B 38/10
See application file for complete search history.

(56) References Cited

U.S. PATENT DOCUMENTS

| | | | |
|---|---|---|---|
| 4,900,387 A | 2/1990 | Johnson | |
| 8,012,292 B2 | 9/2011 | Xie et al. | |
| 2005/0274455 A1* | 12/2005 | Extrand | ..................... C09J 5/00 156/272.4 |
| 2009/0090461 A1 | 4/2009 | Xie et al. | |
| 2015/0075706 A1 | 3/2015 | Cheng et al. | |

FOREIGN PATENT DOCUMENTS

| | | |
|---|---|---|
| CN | 101629056 A | 1/2010 |
| CN | 103413775 A | 11/2013 |
| CN | 105552088 A | 5/2016 |
| TW | 200610648 A | 4/2006 |

OTHER PUBLICATIONS

The First Chinese Office Action dated Jan. 12, 2018; Appln. No. 201610005547.X.

International Search Report and Writien Opinion dated Jan. 22, 2017; PCT/CN2016/105511.

* cited by examiner

*Primary Examiner* — Margaret G Moore
(74) *Attorney, Agent, or Firm* — Ladas & Parry LLP

(57) ABSTRACT

A substrate structure and methods for method for attaching a flexible substrate and for peeling off a flexible substrate are disclosed. The substrate structure includes a carrier substrate and a flexible substrate disposed on the carrier substrate, the substrate structure further including a bonding layer interposed between the carrier substrate and the flexible substrate, or more than one bonding layers parallel interposed between the carrier substrate and the flexible substrate, wherein the bonding layer includes an electroviscosity layer, viscous strength of which changes under effect of electric field, the electroviscosity layer is disposed on a contact surface between the bonding layer and the flexible substrate.

19 Claims, 2 Drawing Sheets

SUBSTRATE STRUCTURE, METHOD FOR ATTACHING FLEXIBLE SUBSTRATE AND METHOD FOR PEELING OFF FLEXIBLE SUBSTRATE

TECHNICAL FIELD

Embodiments of the present invention relates to a substrate structure, a method for attaching a flexible substrate and a method for peeling off a flexible substrate.

BACKGROUND

For recent years, rapid progress is made in a flexible display technique as a next generation display technology. A flexible display device adopts a flexible substrate capable of being curved, which is can be deformed and can be bent. Such a flexible display device also has advantages of being thin and light, and being portable.

Currently, a flexible substrate is typically manufactured by fixing it to a rigid carrier substrate. However, processes for attaching a flexible substrate are relatively complex and it is difficult to peel the finished flexible substrate off, which severely limit development of flexible display devices. At present, there are various methods for fixing a flexible substrate to a carrier substrate, and the methods are roughly classified into two kinds. In one kind of methods, adhesive is utilized, and a flexible substrate is attached onto a carrier substrate and the flexible substrate is peeled off the carrier substrate after devices are formed on the flexible substrate. In the other kind of methods, raw material for a flexible substrate is applied onto a carrier substrate, the flexible substrate is formed through setting, and the flexible substrate is peeled from the carrier substrate after forming devices on the flexible substrate. There are defects existing in the methods as described above. When attaching the flexible substrate to the carrier substrate and peeling off the flexible substrate after forming devices, it is difficult to separate the finished flexible substrate from the carrier substrate, or there is residue of adhesive on the flexible substrate. When applying raw material for the flexible substrate onto the carrier substrate and peeling off the flexible substrate after forming devices on the flexible substrate, it is difficult to fix the flexible substrate onto the carrier substrate, and it is expensive to coat raw material for the flexible substrate and to peel off the flexible substrate.

SUMMARY

At least one embodiment of the present disclosure provides a substrate structure, comprising a carrier substrate, a flexible substrate formed on the carrier substrate, a bonding layer interposed between the carrier substrate and the flexible substrate, or more than one bonding layers parallel interposed between the carrier substrate and the flexible substrate, wherein the bonding layer comprises an electroviscosity layer, viscous strength of which changes under effect of electric field, the electroviscosity layer is disposed on a contact surface between the bonding layer and the flexible substrate.

In one embodiment of the present disclosure, the bonding layer further comprises a base and an adhesive, the base interposed between the electroviscosity layer and the adhesive, the adhesive disposed on a contact surface between the bonding layer and the carrier substrate.

In one embodiment of the present disclosure, the adhesive is an electroviscosity layer.

In one embodiment of the present disclosure, the electroviscosity layer is converted from liquid state into solid state under effect of electric field, viscous strength of the electroviscosity layer in solid state is greater than viscous strength of the electroviscosity layer in liquid state.

In one embodiment of the present disclosure, the greater the intensity of the electric field is, the greater the viscous strength of the adhesive layer is.

In one embodiment of the present disclosure, the electroviscosity layer comprises solid particles and insulating liquid, wherein dielectric constant of the solid particles is greater than that of the insulating liquid.

In one embodiment of the present disclosure, material for the solid particles comprises at least one of silica gel, aluminosilicate, composite metal oxide, composite metal hydroxide, and polymeric semiconductor.

In one embodiment of the present disclosure, the insulating liquid is silicone oil, edible oil, or mineral oil.

In one embodiment of the present disclosure, the base is made of polyvinyl chloride, acrylic, glass or polyester.

At least one embodiment of the present disclosure provides a method for bonding the flexible substrate and the carrier substrate of the substrate structure as described above, comprising: attaching a bonding layer onto the carrier substrate, the boding layer comprising an electroviscosity layer, viscous strength of which changes under effect of electric field, attaching the flexible substrate to the electroviscosity layer, and fixing the flexible substrate to the carrier substrate through the bonding layer by applying an electric field to the boding layer.

In one embodiment of the present disclosure, attaching the bonding layer to the carrier substrate, comprising attaching the bonding layer to the carrier substrate though the adhesive of the bonding layer.

In one embodiment of the present disclosure, the adhesive is the electroviscosity layer.

In one embodiment of the present disclosure, an electric field is applied to the electroviscosity layer, and the electroviscosity layer is converted from liquid state into solid state, wherein viscous strength of the electroviscosity layer in solid state is greater than viscous strength of the electroviscosity layer in liquid state.

At least one embodiment of the present disclosure further provides a method for peeling a flexible substrate off from a carrier substrate of the substrate structure as described above, comprising: after fixing the flexible substrate to the carrier substrate through a bonding layer, stopping applying an electric field to the bonding layer, the bonding layer comprising an electroviscosity layer, viscous strength of which changes under effect of electric field, peeling the flexible substrate from the electroviscosity layer of the bonding layer after stopping applying the electric field.

In one embodiment of the present disclosure, the method for peeling a flexible substrate off from a carrier substrate further comprises peeling the carrier substrate off from the adhesive of the bonding layer.

In one embodiment of the present disclosure, the adhesive is the electroviscosity layer.

In one embodiment of the present disclosure, the method comprises stopping applying the electric field to the bonding layer, converting the electroviscosity layer from solid state to liquid state, wherein the electroviscosity layer has a greater viscous strength in solid state than in liquid state.

At least one embodiment of the present disclosure further provides a substrate structure comprising a carrier substrate and a flexible substrate disposed on the carrier substrate, the substrate structure further comprising a bonding layer interposed between the carrier substrate and the flexible substrate, or more bonding layers parallel interposed between the carrier substrate and the flexible substrate, wherein the bonding layer comprises an electroviscosity layer which is disposed on a contact surface between the bonding layer and the flexible substrate, the electroviscosity layer has a viscous strength which changes under effect of an electric field.

In the embodiments of the present disclosure, an electroviscosity layer, viscous strength of which changes under effect of an electric field, is disposed at a side of the flexible substrate, thus in manufacturing the flexible substrate, the flexible substrate is bonded to the carrier substrate by just applying an electric field to the electroviscosity layer, and the flexible substrate can be peeled off the carrier substrate just by stopping applying the electric field to the electroviscosity layer. And further, the carrier substrate and the bonding layer can be recycled.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Thicknesses and shapes of layers in the figures does not reflect actual thicknesses and shapes of the substrate structure, and are only intended to illustrate contents of the present disclosure.

Figure 1:
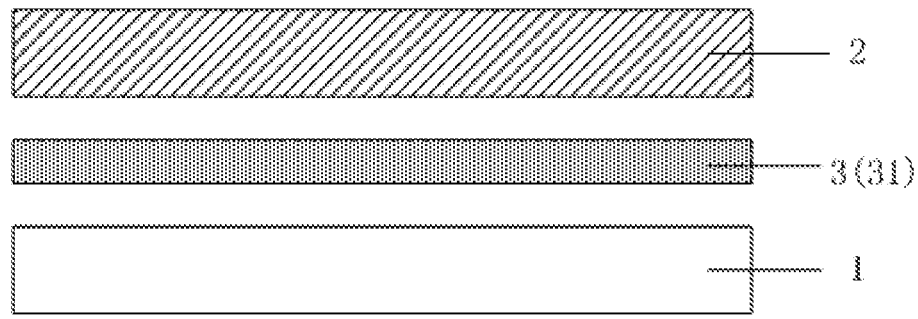
FIG. 1 is an illustrative structural view of a substrate structure according to one embodiment of the present disclosure.
Figure 2:
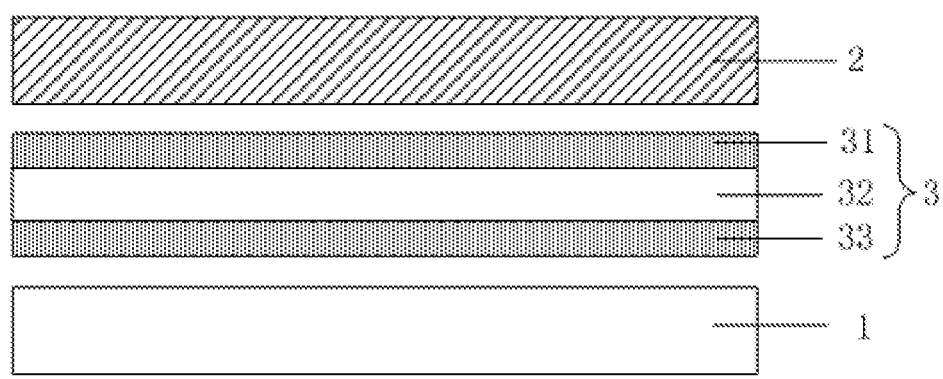
FIG. 2 is an illustrate structural view of a substrate structure according to another embodiment of the present disclosure.
Figure 3:
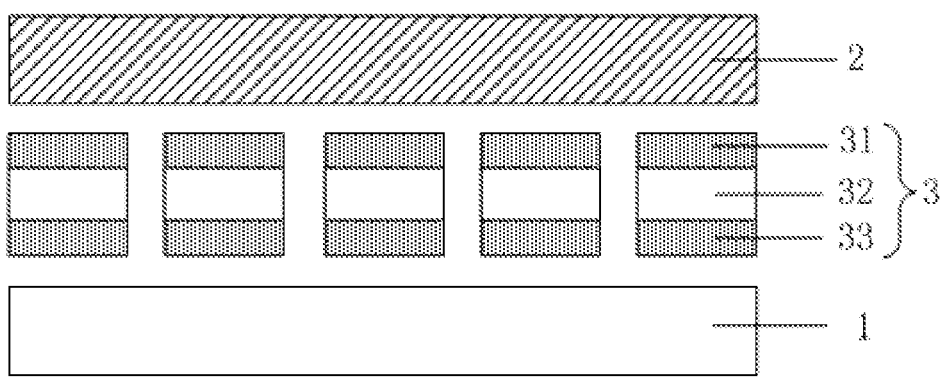
FIG. 3 is an illustrate structural view of a substrate structure according to still another embodiment of the present disclosure.

As illustrated in FIG. 1 to FIG. 3, at least one embodiment of the present disclosure provides a substrate structure comprising a carrier substrate 1, a flexible substrate 2 disposed on the carrier substrate 1, and further comprising one bonding layer 3 disposed between the carrier substrate 1 and the flexible substrate 2 or more than one bonding layers 3 parallel disposed between the carrier substrate 1 and the flexible substrate 2, the bonding layer 3 comprising an electroviscosity layer 31, viscous strength of which changes under effect of electric field, the electroviscosity layer 31 disposed on the contact surface between the bonding layer 3 and the flexible substrate 2.

In the substrate structure according to one embodiment of the present disclosure, as the viscous strength of the electroviscosity layer disposed on the contact surface between the bonding layer and the flexible substrate changes under effect of an electric field, thus, during manufacturing the flexible substrate, the flexible substrate can be bonded to the carrier substrate through just applying an electric field to the electroviscosity layer, and the flexible substrate can be peeled off the carrier substrate through stopping applying the electric field to the electroviscosity layer. And further, the carrier substrate and the bonding layer can be recycled.

According to one embodiment of the present disclosure, the carrier substrate is a rigid glass substrate.

In one embodiment of the present disclosure, the electroviscosity layer is converted from liquid state into solid state under effect of an electric field, the viscous strength of the electroviscosity layer in solid state is greater than the viscous strength of the electroviscosity layer in liquid state. That is, the electroviscosity layer can be converted from suspension with low viscous strength into viscous solid with high viscous strength, under effect of electric field.

The process that the electroviscosity layer is converted from liquid state into solid state under effect of electric field is reversible. After stopping applying the electric field, the electroviscosity layer is converted from solid state into liquid state, viscous strength of which is low.

In one embodiment of the present disclosure, the greater the intensity of the applied electric field is, the greater the viscous strength of the electroviscosity layer is after the electroviscosity layer is converted into solid state. When no electric field is applied, i.e., intensity of the electric field is zero, the electroviscosity layer is in liquid state. And when an electric field is applied, the electroviscosity layer is converted from liquid state into solid state under effect of electric field, and the greater the intensity of the applied electric field is, the greater the viscous strength of the electroviscosity layer is after the electroviscosity layer is converted into solid state. The viscous strength of the electroviscosity layer can be adjusted by applying electric fields with different intensity.

As illustrated in FIG. 1, in one embodiment of the present disclosure, there is only one electroviscosity layer 31 disposed between the carrier substrate 1 and the flexible substrate 2. As the electroviscosity layer 31 has excellent fluidity in liquid state, and can be easily applied onto the back side or the periphery area of the carrier.

In one embodiment of the present disclosure, the bonding layer can be configured to have a structure of three layers. As illustrated in FIG. 2 and FIG. 3, the bonding layer 3 further comprises a base 32 and adhesive 33, the adhesive 33 is configured on the contact surface between the bonding layer 3 and the carrier substrate 1, the electroviscosity layer 31 is disposed on a contact surface between the bonding layer 3 and the flexible substrate 2, the base 32 is sandwiched between the electroviscosity layer 31 and the adhesive 33. Thus, the bonding layer can be prepared separately, and then can be directly bonded onto the carrier substrate. It is no need to apply an electroviscosity layer onto the carrier substrate, thereby simplifying the manufacturing processes and reducing the cost.

And further, in one embodiment of the present disclosure, the adhesive 33 can be a double sided tape. And then, the bonding layer and the carrier substrate can be recycled as a whole. The adhesive 33 can be alternatively be an electroviscosity layer, as illustrated in FIG. 2 and FIG. 3, when the adhesive 33 is selected to be an electroviscosity layer, viscous strength of which changes under effect of electric field, the carrier substrate can be recycled independently as electroviscosity liquid can be removed easily.

In one embodiment of the present disclosure, the electroviscosity layer is a suspension with very low viscous strength at normal condition (where no electric field is applied), which is formed by dispersing evenly solid particles in an insulating liquid, wherein the solid particles have an dielectric constant greater than the insulating liquid.

Furthermore, the solid particles can be made of inorganic material, poly material, or composite material. The composite material can be compounded of different inorganic materials, or can be compounded of different poly materials, or can be compounded of inorganic material and poly material. Materials for the solid particles comprise at least one of silica gel, aluminosilicate, composite metal oxide, composite metal hydroxide, and polymeric semiconductor. The material for the solid particles can be selected according to actual requirements and is not limited herein.

The insulating liquid can be selected from materials of high boiling point which have good stability and are of resistance to erosion. Thus, the insulating liquid can be selected as at least one of silicone oil, edible oil, and mineral oil. The insulating liquid can be selected according to actual requirements and is not limited herein.

In one embodiment of the present disclosure, material for the base can be selected from polyvinyl chloride (PVC), acrylic (PMMA), glass or polyester. Such a base can decrease the cost, and is difficult to be contaminated.

Based on the same inventive concept, at least one embodiment of the present disclosure provides a method for bonding the flexible substrate to the carrier substrate. The operation principle for the method is similar to the operation principle for the substrate structure and implementation of the method can refer to the implementation of the substrate structure, and description in common will be omitted.

Figure 4:
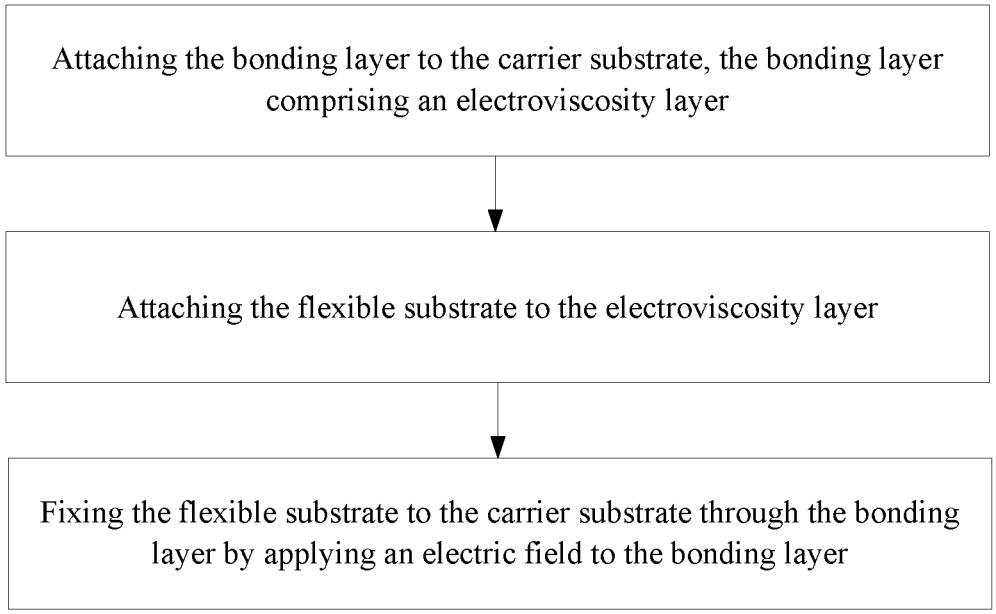
FIG. 4 is a flow chart of a method for bonding a flexible substrate according to one embodiment of the present disclosure.

As illustrated in FIG. 4, in one embodiment of the present disclosure, the method for bonding the flexible substrate to the carrier substrate comprises: attaching the bonding layer to the carrier substrate, the bonding layer comprising an electroviscosity layer, viscous strength of which changes under effect of electric field, attaching the flexible substrate to the electroviscosity layer, and fixing the flexible substrate to the carrier substrate through the bonding layer by applying an electric field to the bonding layer.

In the bonding method as described above, the flexible substrate is attached to the electroviscosity layer, viscous strength of which changes under effect of electric field, the viscous strength of the electroviscosity layer can be adjusted by applying electric fields with different intensity. Thus, the flexible substrate can be bonded to the carrier substrate easily and conveniently.

In one embodiment of the present disclosure, attaching the bonding layer to the carrier substrate can be implemented by attaching the bonding layer to the carrier substrate through the adhesive of the bonding layer.

It should be noted that, the bonding layer can be manufactured separately, and adhesive can be respectively applied to the two opposite sides of the base so as to configure the bonding layer to have a structure of three structures, the adhesive applied on the contact surface between the base and the flexible substrate is an electroviscosity layer, and the adhesive applied on the contact surface between the base and the carrier substrate can be adhesive of various manners. Thus, the bonding layer can be directly attached to the carrier substrate without applying an electroviscosity layer to the carrier substrate, thereby simplifying the processes and decreasing the cost.

And further, in one embodiment of the present disclosure, the adhesive disposed on the contact surface between the base and the carrier substrate can be an electroviscosity layer. Thus, the carrier substrate can be recycled independently as electroviscosity liquid can be easily removed.

In one embodiment of the present disclosure, an electric field is applied to the electroviscosity layer and the electroviscosity layer is converted from liquid state into solid state, wherein the viscous strength of the electroviscosity layer in solid state is greater than that of the electroviscosity layer in liquid state. Then, under effect of the electric field, the electroviscosity layer is converted from suspension with low viscosity into a viscous solid with high viscosity, and the flexible substrate and the carrier substrate are bonded together.

Based on the same inventive concept, at least one embodiment of the present disclosure further provides a method for peeling the flexible substrate off the carrier substrate. The operation principle for the method is similar to the operation principle for the substrate structure and implementation of the method can refer to the implementation of the substrate structure, and description in common will be omitted.

Figure 5:
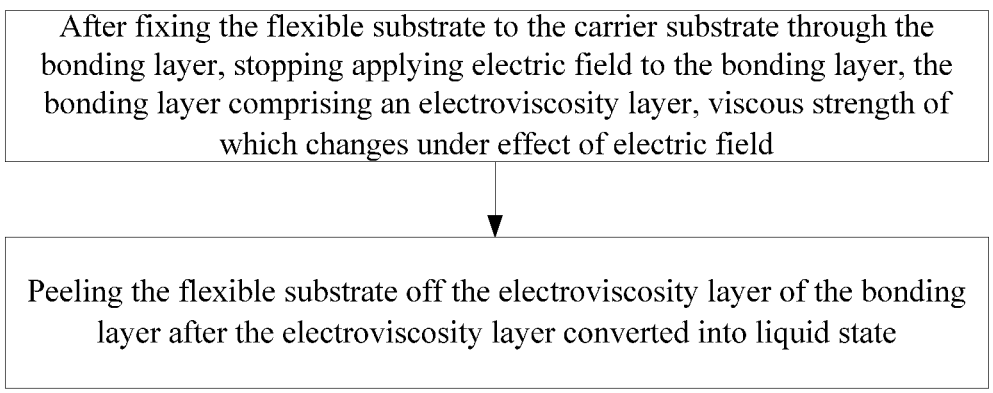
FIG. 5 is a flow chart of a method for peeling off a flexible substrate according to one embodiment of the present disclosure.

As illustrate in FIG. 5, in one embodiment of the present disclosure, the method for peeling the flexible substrate off the substrate structure comprises: after fixing the flexible substrate to the carrier substrate through the bonding layer, stopping applying electric field to the bonding layer, the bonding layer comprising an electroviscosity layer, viscous strength of which changes under effect of electric field, peeling the flexible substrate off the electroviscosity layer of the bonding layer after the electroviscosity layer converted into liquid state.

In the method for peeling the flexible substrate from the substrate structure, after stopping applying the electric field, the viscous strength of the electroviscosity layer is changed from high to low, and then the flexible substrate can be peeled off. The method is easy to be performed, and the flexible substrate can be peeled off without being damaged. And at the same time, the method has the following advantages: the bonding layer and the carrier substrate being recyclable, easy remove of the electroviscosity layer, and no contamination.

In one embodiment of the present disclosure, the method for peeling the flexible substrate off the substrate structure further comprises: peeling the carrier substrate off the adhesive of the bonding layer.

In one embodiment of the present disclosure, when the adhesive in contact with the carrier substrate is an electroviscosity layer, after stopping applying the electric field, the viscous strength of the electroviscosity layer is changed to low. Thus, the carrier substrate can be easily peeled off and the carrier substrate can be recycled solely.

In one embodiment of the present disclosure, after stopping applying the electric field, the electroviscosity layer is converted from solid state to liquid state, and the viscous strength of the electroviscosity layer in solid state is greater than the viscous strength of the electroviscosity layer in liquid state. After stopping applying the electric field, the electroviscosity layer is converted from a viscous solid with high viscous strength to a suspension with low viscous strength, thereby facilitating peeling off the flexible substrate.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201610005547.X filed on Jan. 4, 2016, the disclosure of which is hereby entirely incorporated by reference.

The invention claimed is:

1. A substrate structure, comprising a carrier substrate and a flexible substrate disposed on the carrier substrate, the substrate structure further comprising more than one bonding layer parallel interposed between the carrier substrate and the flexible substrate, wherein each of the more than one bonding layer comprises an electroviscosity layer, viscous strength of which changes under effect of electric field, the electroviscosity layer is disposed on a contact surface between the bonding layer and the flexible substrate.

2. The substrate structure according to claim 1, wherein each of the more than one bonding layer further comprises a base and an adhesive, the base interposed between the electroviscosity layer and the adhesive, and the adhesive disposed on a contact surface between the bonding layer and the carrier substrate.

3. The substrate structure according to claim 1, wherein the electroviscosity layer comprises solid particles and insulating liquid, dielectric constant of the solid particles is greater than that of the insulating liquid.

4. A method for bonding the flexible substrate of the substrate structure according to claim 1, comprising:
attaching the bonding layer onto the carrier substrate, the boding layer comprising an electroviscosity layer, viscous strength of which changes under effect of electric field, the electroviscosity layer disposed away from the carrier substrate;
attaching the flexible substrate to the electroviscosity layer; and
fixing the flexible substrate to the carrier substrate through the bonding layer by applying an electric field to the boding layer.

5. The method according to claim 4, wherein attaching the bonding layer to the carrier substrate comprises attaching the bonding layer to the carrier substrate though the adhesive of the bonding layer.

6. The method according to claim 5, wherein the adhesive is the electroviscosity layer.

7. The method according to claim 4, wherein an electric field is applied to the electroviscosity layer, and the electroviscosity layer is converted from liquid state into solid state, viscous strength of the electroviscosity layer in solid state is greater than viscous strength of the electroviscosity layer in liquid state.

8. A method for peeling the flexible substrate off the substrate structure according to claim 1, comprising:
after fixing the flexible substrate to the carrier substrate through a bonding layer, stopping applying the electric field to the bonding layer; and
peeling the flexible substrate from the electroviscosity layer of the bonding layer after stopping applying the electric field.

9. The method according to claim 8, further comprising: peeling the carrier substrate off from the adhesive of the bonding layer.

10. The method according to claim 9, wherein the adhesive is the electroviscosity layer.

11. The method according to claim 8, wherein after stopping applying the electric field, the electroviscosity layer is converted to liquid state from solid state, the electroviscosity layer has a greater viscous strength in solid state than in liquid state.

12. A substrate structure comprising a carrier substrate and a flexible substrate disposed on the carrier substrate, the substrate structure further comprising more than one bonding layer parallel interposed between the carrier substrate and the flexible substrate, wherein each of the more than one bonding layer comprises an electroviscosity layer having a viscous strength which changes under effect of an electric field; the electroviscosity layer is disposed on a side of the bonding layer in con tact with the carrier substrate.

13. A substrate structure, comprising a carrier substrate and a flexible substrate disposed on the carrier substrate, the substrate structure further comprising a bonding layer interposed between the carrier substrate and the flexible substrate, or more than one bonding layer parallel interposed between the carrier substrate and the flexible substrate, wherein the bonding layer or each of the more than one bonding layer comprises an electroviscosity layer, viscous strength of which changes under effect of electric field, the electroviscosity layer is disposed on a contact surface between the bonding layer and the flexible substrate, wherein the bonding layer or each, of the more than one bonding layer further comprises a base and an adhesive, the base interposed between the electroviscosity layer and the adhesive, and the adhesive disposed on a contact surface between the bonding layer and the carrier substrate, and wherein the adhesive is another electroviscosity layer.

14. The substrate structure according to claim 13, wherein the electroviscosity layer is converted from liquid state into solid state under effect of electric field, viscous strength of the electroviscosity layer in solid state is greater than viscous strength of the electroviscosity layer in liquid state.

15. The substrate structure according to claim 14, wherein the greater the intensity of the electric field is, the greater the viscous strength of the electroviscosity layer in solid state.

16. The substrate structure according to claim 13, wherein the electroviscosity layer comprises solid particles and insulating liquid, dielectric constant of the solid particles is greater than that of the insulating liquid.

17. The substrate structure according to claim 16, wherein material for the solid particles comprises at least one of silica gel, aluminosilicate, composite metal oxide, composite metal hydroxide, and polymeric semiconductor.

18. The substrate structure according to claim 16, wherein the insulating liquid is at least one of silicone oil, edible oil, and mineral oil.

19. The substrate structure according to claim 13, wherein the base is made of polyvinyl chloride, acrylic, glass or polyester.

* * * * *